United States Patent
Kim

(10) Patent No.: US 8,331,179 B2
(45) Date of Patent: Dec. 11, 2012

(54) PRECHARGE SIGNAL GENERATOR AND SEMICONDUCTOR MEMORY DEVICE

(75) Inventor: Youk Hee Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 235 days.

(21) Appl. No.: 12/647,786

(22) Filed: Dec. 28, 2009

(65) Prior Publication Data

US 2010/0329048 A1  Dec. 30, 2010

(30) Foreign Application Priority Data

Jun. 26, 2009 (KR) .................. 10-2009-0057627

(51) Int. Cl.
*G11C 7/00* (2006.01)
(52) U.S. Cl. .............. 365/203; 365/189.05; 365/194
(58) Field of Classification Search .......... 365/203, 365/194, 189.05
See application file for complete search history.

(56) References Cited

U.S. PATENT DOCUMENTS

| 7,042,796 B2 * | 5/2006 | Kim et al. | 365/230.06 |
| 7,379,371 B2 * | 5/2008 | Im et al. | 365/222 |
| 7,502,268 B2 * | 3/2009 | Choi et al. | 365/201 |

FOREIGN PATENT DOCUMENTS

| KR | 1020060066203 A | 6/2006 |
| KR | 1020070036631 A | 4/2007 |

* cited by examiner

*Primary Examiner* — Hoai V Ho
*Assistant Examiner* — Tri Hoang
(74) *Attorney, Agent, or Firm* — Ladas & Parry LLP

(57) ABSTRACT

A precharge signal generator having a latch signal generator, an internal signal generator, and a pulse generator is presented. The latch signal generator is configured to generate a latch signal that is activated in response to an auto-precharge command and inactivated in response to an active pulse. The internal signal generator is configured to generate an internal signal activated when a delayed active signal and the latch signal are all activated. The pulse generator is configured to generate a precharge signal including a pulse that is activated in a period for which the internal signal is being active.

14 Claims, 6 Drawing Sheets

_US 8,331,179 B2_

PRECHARGE SIGNAL GENERATOR AND SEMICONDUCTOR MEMORY DEVICE

CROSS REFERENCES TO RELATED PATENT APPLICATION

The present application claims priority under 35 U.S.C 119(a) to Korean Application No. 10-2009-0057627, filed on Jun. 26, 2009, in the Korean Intellectual Property Office, which is incorporated herein by reference in its entirety as set forth in full.

BACKGROUND

This disclosure relate to precharge signal generator of semiconductor memory device.

General operations for generating a precharge signal from an auto-precharge read or write command in a semiconductor memory device are shown in FIGS. 1 and 2.

Referring to FIG. 1, a procedure for generating the precharge signal in the condition that an active command is re-input after an input of the active command and the auto-precharge read or write command is as follows.

First, when the active command ACT_COM is input at time A1, then a bank access signal BA is activated to a high level. Following this, at a predetermined period, a delayed active signal ACTd is activated to a high level.

Next, if the auto-precharge read or write command is input at a time A2, then an auto-precharge command AP_COM is generated as a low level pulse. The low level pulse of the auto-precharge command AP_COM then enables a precharge signal PCG1 to be generated as a high level pulse X. The high level pulse X of the precharge signal PCG1 results in making the bank access signal BA and the delayed active signal ACTd to become inactivated at low levels to precharge the semiconductor memory device.

After that, if the active command ACT_COM is re-input at a time A3, then the bank access signal BA is re-activated at a high level and, after a predetermined period, the delayed active signal ACTd is re-activated to a high level to normally conduct an active operation of the semiconductor memory device.

In another procedure, generating the precharge signal in the condition that an active command is re-input after an illegal input of a precharge command since the active command and the auto-precharge read or write command have been input, can be explained by referring to FIG. 2.

First, when the precharge command PCG_COM is improperly input at a time B2, the bank access signal BA is activated at a high level and, after a predetermined period, the delayed active signal ACTd is subsequently inactivated into a high level.

Next, if the precharge command PCG_COM is improperly input at time B2, then the bank access signal BA and the delayed active signal ACTd are subsequently inactivated into low levels after a predetermined period.

Next, if either the auto-precharge read command or the auto-precharge write command is improperly input at a time B3, then the auto-precharge command AP_COM is generated at a low level pulse. The low level pulse of the auto-precharge command AP_COM enables the precharge signal PCG1 to be generated at a high level pulse Y.

Afterward, if the active command ACT_COM is re-input at time B4, then the bank access signal BA is again activated at a high level and, after a predetermined period, then the delayed active signal ACTd is again activated at a high level.

However, because the bank access signal BA and the delayed active signal ACTd, which have been activated in high levels at the time B3, are all inactivated to low levels in response to the precharge signal PCG1 of the high level pulse Y, then active operations are abnormally terminated.

SUMMARY

Accordingly, exemplary embodiments provide a precharge signal generator capable of substantially preventing an active operation from abnormal termination caused by an illegal input of a precharge command, by initializing an internal node of a circuit generating a precharge signal in response to an active command even if the precharge command is illegally applied before an auto-precharge operation after an input of an auto-precharge read or write command.

In exemplary embodiments, a precharge signal generator may include a latch signal generator configured to generate a latch signal that is activated in response to an auto-precharge command and inactivated in response to an active pulse, an internal signal generator configured to generate an internal signal activated if a delayed active signal and the latch signal are all activated, and a pulse generator configured to generate a precharge signal including a pulse that is activated in a period for which the internal signal is being active.

In exemplary embodiments, a semiconductor memory device may include a command decoder configured to generate a bank access signal and a delayed active signal in response to an active command and a precharge command, an active pulse generator configured to generate an active pulse in response to the bank access signal, and a precharge signal generator configured to generate a precharge signal in response to the delayed active pulse, the active pulse and the auto-precharge command.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention. Like numbers refer to like elements throughout the description of the drawings.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In order to more specifically describe exemplary embodiments, various aspects will be hereinafter described in detail with reference to the attached drawings.

Figure 1:
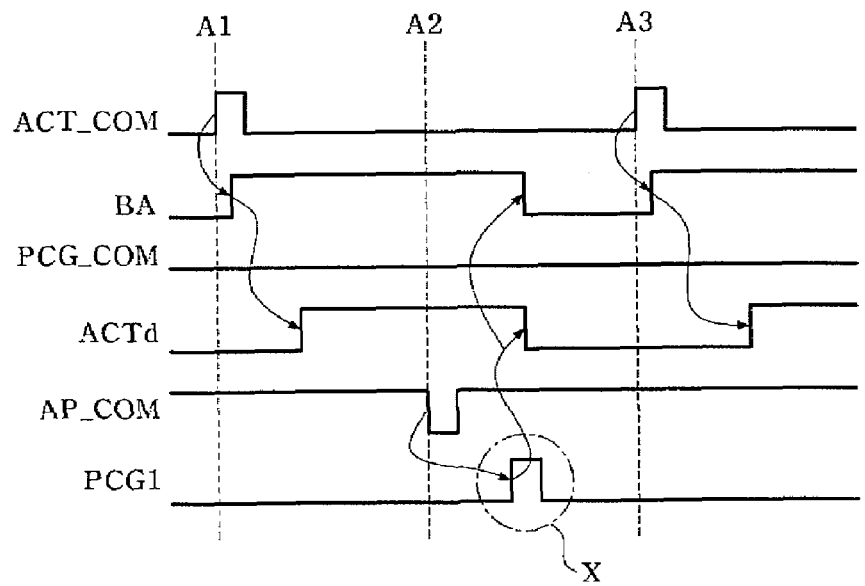
FIGS. 1 and 2 are timing diagrams showing general operations for generating a precharge signal from an auto-precharge read or write command.
Figure 2:
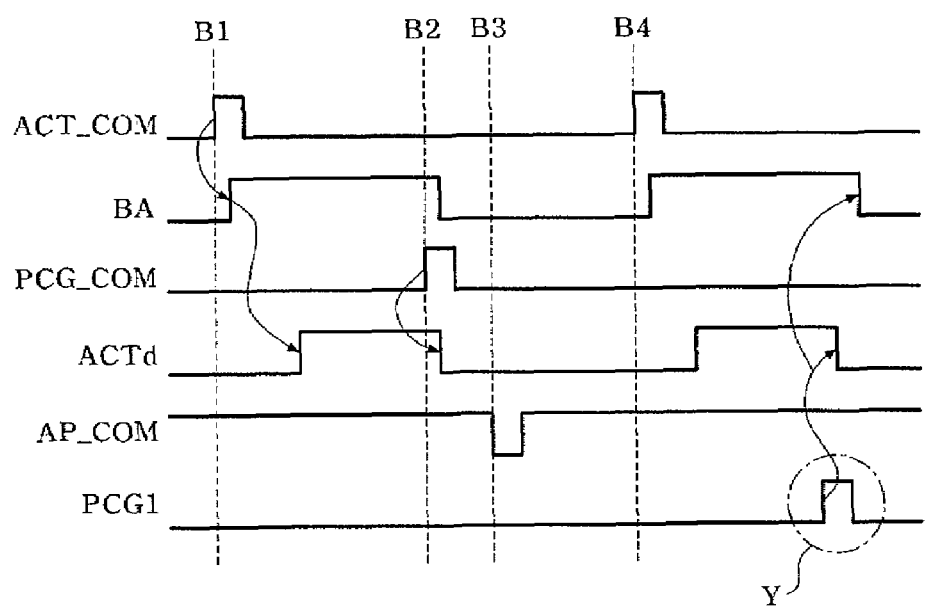
Figure 3:
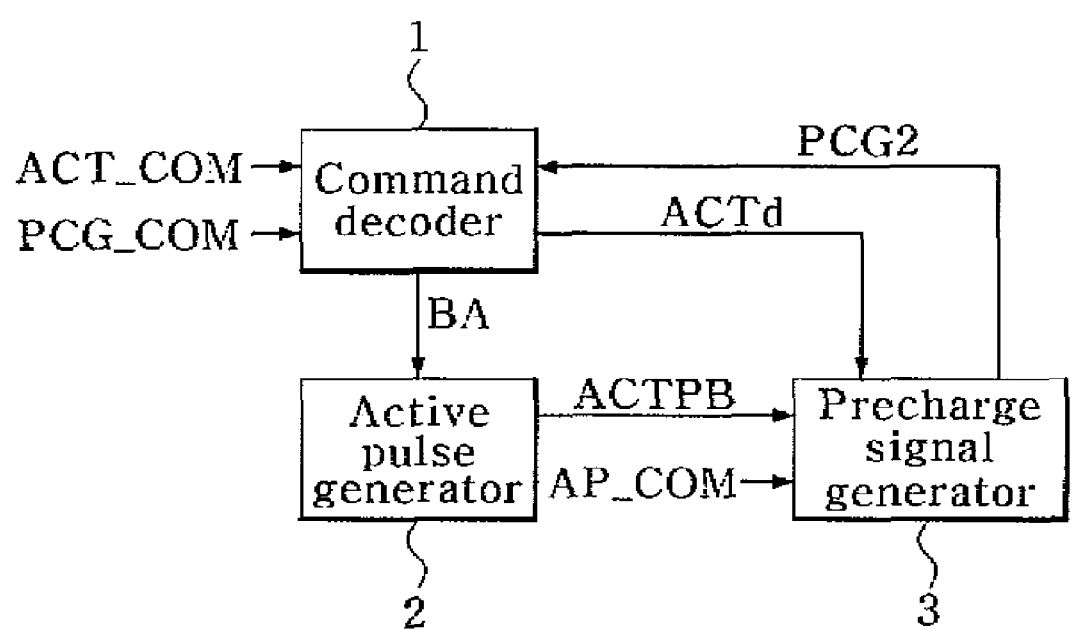
FIG. 3 is a block diagram of a semiconductor memory device including a precharge signal generator according to exemplary embodiments of the present invention.

FIG. 3 illustrates a functional organization of a semiconductor memory device including a precharge signal generator according to exemplary embodiments of the present invention.

Referring now to FIG. 3, the semiconductor memory device may comprise a command decoder 1, an active pulse generator 2 and a precharge signal generator 3.

Figure 4:
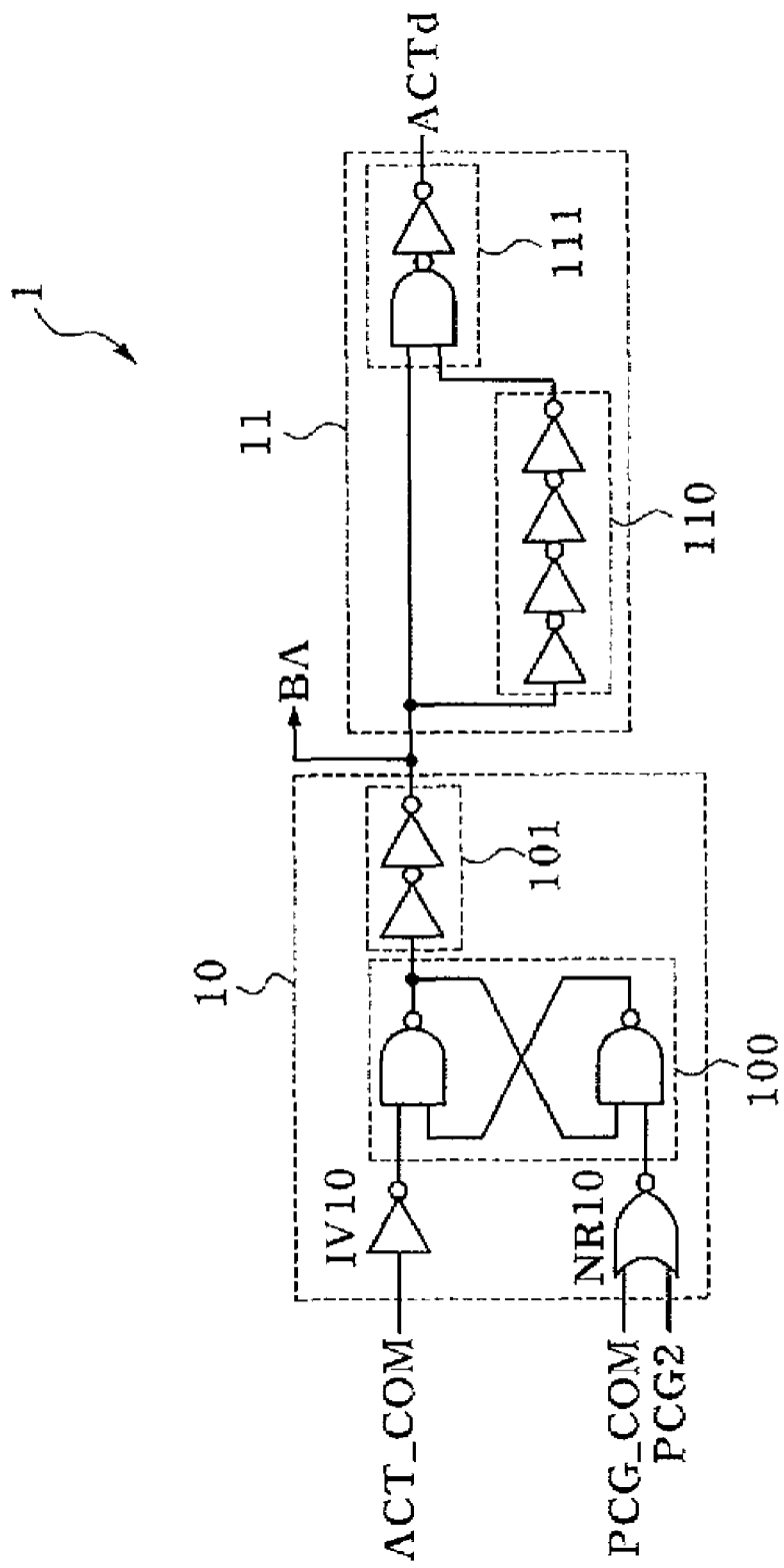
FIG. 4 is a circuit diagram illustrating the command decoder included in the semiconductor memory device of FIG. 3.

The command decoder 1, as illustrated in FIG. 4, is shown to include a bank access signal generator 10 and a delayed active signal generator 11. The bank access signal generator 10 is exemplarily composed of a NOR gate NR10, a latch 100, and a buffer 101. The NOR gate NR10 executes a not-OR operation with a precharge command PCG_COM and a precharge signal PCG2. The latch 100 receives an inverted signal of an active command SCT_COM as a set signal and receives an output signal of the NOR gate NR10 as a reset signal. The buffer 101 generates a bank access signal BA from an output signal of the latch 100. With this configuration, the bank access signal generator 10 operates to generate the bank access signal BA that is activated at a high level when the active command ACT_COM is input as a high level pulse, but the bank access signal generator 10 inactivates the bank access signal BA to a low level when there are high level pulse inputs of the precharge command PCG_COM and the precharge signal PCG2.

The delayed active signal generator 11 is exemplarily composed of a delay circuit 110 and a logic circuit 111. The delay circuit 110 is configured to delay the bank access signal BA for a predetermined period. The logic circuit 111 is configured to execute with the bank access signal BA and an output signal of the delay circuit 110. With this configuration, the delayed active signal generator 11 operates to generate a delayed active signal ACTd that is activated at a high level after the delay period of the delay circuit 110 since the bank access signal BA has been activated to a high level.

Figure 5:
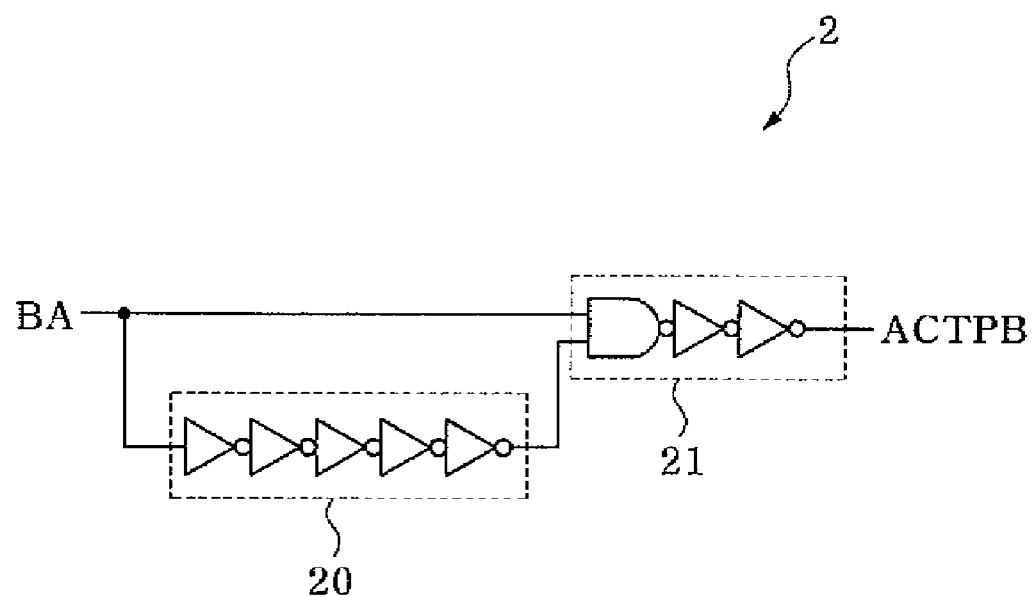
FIG. 5 is a circuit diagram illustrating the active pulse generator included in the semiconductor memory device of FIG. 3.

The active pulse generator 2, as illustrated in FIG. 5, is exemplarily composed of an inversion delay circuit 20 and a logic circuit 21. The inversion delay circuit 20 is configured to inversely delay the bank access signal BA. The logic circuit 21 is configured to execute a not-OR operation with the back access signal BA and an output signal of the inversion delay circuit 20. With this exemplarily structure, the active pulse generator 2 operates to generate an active pulse ACTPB that is being active in a low level for a delay period of the inversion delay circuit 20 from when the bank access signal has been activated to a high level.

Figure 6:
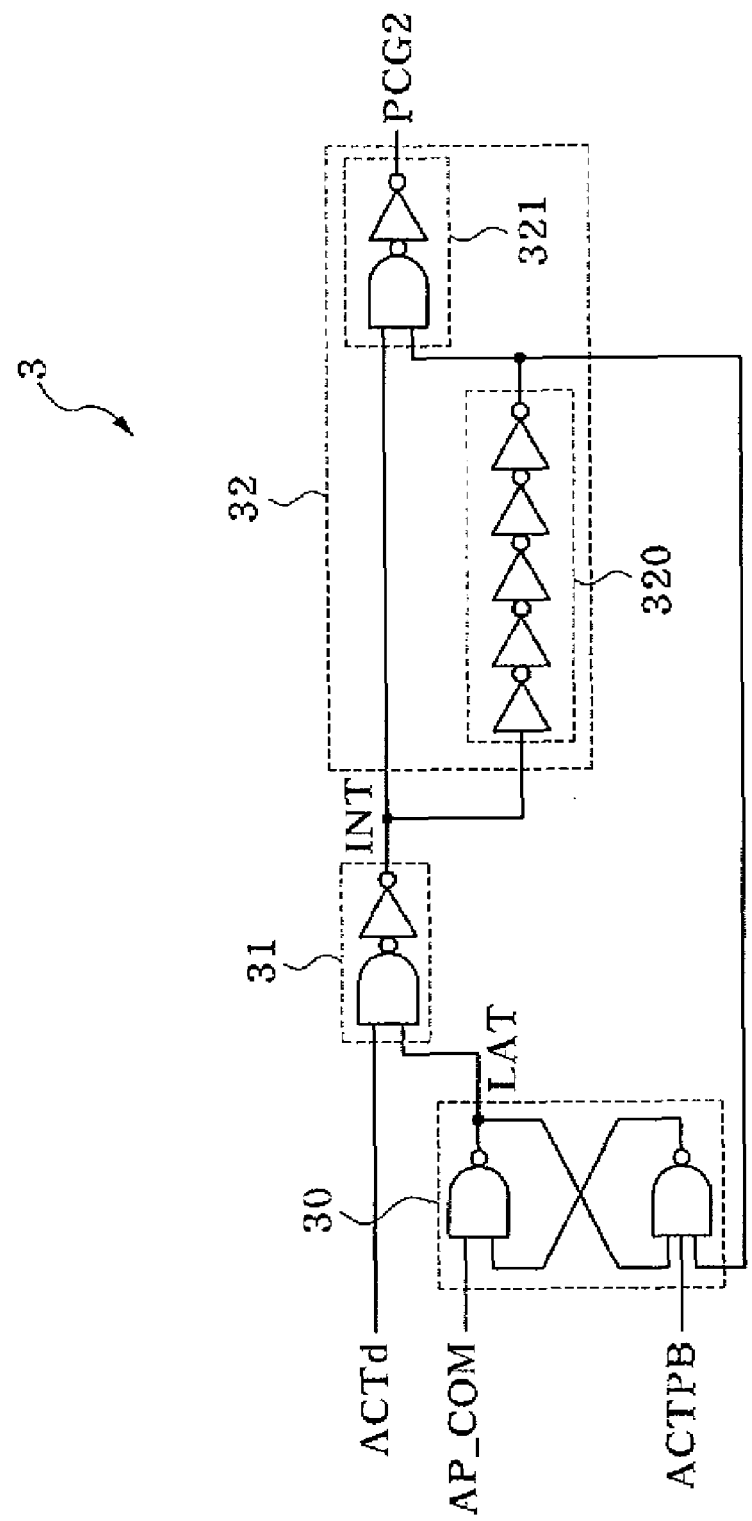
FIG. 6 is a circuit diagram illustrating the precharge signal generator included in the semiconductor memory device of FIG. 3.

Now referring to FIG. 6, the precharge signal generator 3 may comprise a latch signal generator 30, an internal signal generator 31 and a pulse generator 32. The latch signal generator 30 may be configured as an SR latch receiving an auto-precharge command AP_COM as a set signal and receiving the active pulse ACTPB and an output signal of an inversion delay circuit 320 as a reset signal. With this configuration, the precharge signal generator 3 outputs a latch signal LAT that is activated if a low level pulse of an auto-precharge command AP_COM is input thereto. The latch signal LAT is inactivated into a low level when the active pulse ACTPB is input or the output signal of the inversion delay circuit 320 is input in at a low level. The internal signal generator 31 operates to generate an internal signal INT through an OR operation with the delayed active signal ACTd and the latch signal LAT. The pulse generator 32 is exemplarily composed of the inversion delay circuit 320 and a logic circuit 321. The inversion delay circuit 320 is configured to inversely delay the internal signal INT. The logic circuit 321 is configured to execute an AND operation with the output signal of the inversion delay circuit 320 and the internal signal INT. The pulse generator 32 operates to generate a precharge signal PCG2 that is being active for a delay period of the inversion delay circuit 320 from a time when the internal signal INT has been activated to a high level. Here, the auto-precharge command AP_COM is generated to be in a low level pulse when an auto-precharge read or write command is applied to the semiconductor memory device.

With this exemplarily organization, the precharge signal generator 3 operates to generate the precharge signal PCG2 that is being active as long as the delay period of the inversion delay circuit 320 if the low level pulse of the auto-precharge command AP_COM appears in the condition that the delayed active signal ACTd is set at a high level. During this, the internal signal INT is initialized to be at a low level by the active pulse ACTB.

Now, hereinafter will be a detailed sequential operation for generating the precharge signal PCG2 in the condition that the active command is re-input after an improper input of the precharge command since the active command and the auto-precharge read or write command have been input to the semiconductor memory device.

Figure 7:
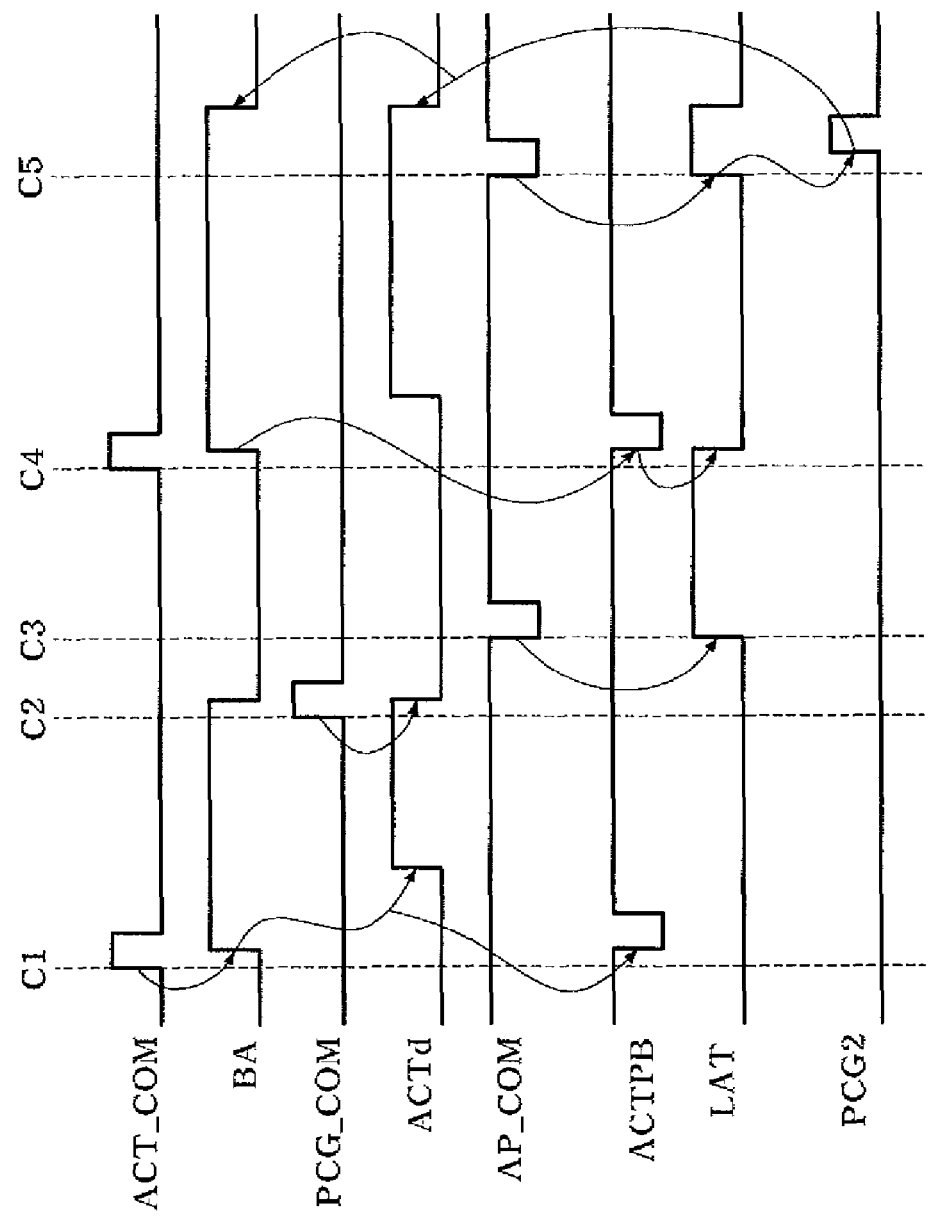
FIG. 7 is a timing diagram showing an operation of the semiconductor memory device.

Referring to FIG. 7, when the active command ACT_COM is input at a time C1, then the bank access signal generator 10 of the command decoder 1 is configured to activate the bank access signal BA into a high level and consequently the delayed active signal generator 11 outputs the delayed active signal ACTd that is activated into a high level after the delay period of the delay circuit 110 since the bank access signal BA has been activated to a high level.

Next, if the precharge command PCG_COM is an improperly input at a time C2, then the bank access signal BA and the delayed active signal ACTd are inactivated at a low levels.

In response to the auto-precharge read or write command that is input at a time C3, the auto-precharge command AP_COM is generated in the low level pulse. The latch signal generator 30 of the precharge signal generator 3, to which the low level pulse of the auto-precharge command AP_COM is applied, then inactivates the latch signal LAT to be in a high level.

Afterward, if the active command ACT_COM is re-input at a time C4, then the bank access signal generator 10 of the command decoder 1 again activates the bank access signal BA to a high level and the delayed active signal generator 11 outputs the delayed active signal ACTd that is activated to a high level after the delay period of the delay circuit 110 since the bank access signal BA has been activated in a high level.

During this, the active pulse signal generator 2 outputs the active pulse ACTPB that is being active in a low level, responding to the bank access signal BA of a high level, for the delay period of the inversion delay circuit 20 from when the bank access signal BA has been activated to a high level. The latch signal generator 30 of the precharge signal generator 3, to which the low level pulse of the active pulse ACTPB is applied, inactivates the latch signal LAT to a low level.

Next, if the auto-precharge read or write command is input at a time C5, the auto-precharge command AP_COM is generated in the low level pulse. Responding to the low level pulse of the auto-precharge command AP_COM, the latch signal generator 30 of the precharge signal generator 3 activates the latch signal LAT to a high level.

As stated above, even though an improperly input of the precharge command PCG_COM may arise for some unknown reason, then the precharge signal generator according to exemplary embodiments of the present invention is useful in substantially preventing an active operation from abnormal termination—this could be caused by the improper input of the precharge command PCG_COM because the latch signal LAT is inactivated to a low level by the active pulse ACTPB generated from the active command ACT_COM.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A precharge signal generator, comprising:
    a latch signal generator configured to generate a latch signal that is activated in response to an auto-precharge command and inactivated in response to an active pulse;
    an internal signal generator configured to generate an internal signal activated when a delayed active signal and the latch signal are both activated; and
    a pulse generator configured to generate a precharge signal including a pulse that is activated when the internal signal is activated, wherein the active pulse is generated in a pulse when an active command is inputted, the latch signal is enabled when the auto-precharge command is inputted, and the latch signal is disabled when the active pulse is generated in a pulse.

2. The precharge signal generator according to claim 1, wherein the pulse generator comprises:
    an inversion delay circuit configured to inversely delay the internal signal; and
    a logic circuit configured to generate the precharge signal through a logical operation with the internal signal and the inversely delayed internal signal.

3. The precharge signal generator according to claim 2, wherein the latch signal generator outputs the latch signal that is activated when the pulse of the auto-precharge command is input and inactivated when the active pulse is input or the internal signal activated is input into the inversion delay circuit.

4. The precharge signal generator according to claim 1, wherein the auto-precharge command is generated in a pulse when an auto-precharge read or write command is input.

5. A semiconductor memory device, comprising:
    a command decoder configured to generate a bank access signal and a delayed active signal in response to an active command, a precharge command and a precharge signal;
    an active pulse generator configured to generate an active pulse in response to the bank access signal when an active command is inputted; and
    a precharge signal generator configured to generate the precharge signal in response to the delayed active pulse, the active pulse and the auto-precharge command, wherein the precharge signal is disabled when the active pulse is generated.

6. The semiconductor memory device according to claim 5, wherein the command decoder inactivates the bank access signal when a pulse of the active command is input, the command decoder activates the delayed active signal after a predetermined period, and the command decoder inactivates the bank access signal and the delayed active signal when either the precharge command or the precharge signal are input.

7. The semiconductor memory device according to claim 6, wherein the command decoder comprises:
    a bank access signal generator configured to generate the bank access signal in response to the precharge command and the precharge signal, the bank access signal being activated when the pulse of the active command is input and the bank access signal being inactivated when the precharge command or the precharge signal is input in a pulse; and
    a delayed active signal generator configured to generate the delayed active signal that is activated after a predetermined period subsequent to when the bank access signal has been activated.

8. The semiconductor memory device according to claim 7, wherein the bank access generator comprises:
    a logic element configured to execute a logical operation with the precharge command and the precharge signal; and
    a latch configured to receive and latch an inverted signal of the precharge command and an output signal of the logic element.

9. The semiconductor memory device according to claim 7, wherein the delayed active signal generator comprises:
    a delay circuit configured to delay the bank access signal in the predetermined period; and
    a logic circuit configured to execute a logical operation with the bank access signal and an output signal of the delay circuit.

10. The semiconductor memory device according to claim 5, wherein the active pulse generator comprises:
    an inversion delay circuit configured to inversely delay the bank access signal; and
    a logic circuit configured to execute a logical operation with the bank access signal and an output signal of the inversion delay circuit.

11. The semiconductor memory device according to claim 5, wherein the precharge signal generator comprises:
    a latch signal generator configured to generate a latch signal that is activated in response to the auto-precharge command and the latch signal generator configured to generate the latch signal inactivated in response to the active pulse;

an internal signal generator configured to generate an internal signal activated when the delayed active signal and the latch signal are both activated; and a pulse generator configured to generate the precharge signal including a pulse that is activated when the internal signal is active.

12. The semiconductor memory device according to claim 11, wherein the pulse generator comprises:

an inversion delay circuit configured to inversely delay the internal signal; and a logic circuit configured to generate the precharge signal through a logical operation with the internal signal and an output signal of the inversion delay circuit.

13. The semiconductor memory device according to claim 12, wherein the latch signal generator outputs the latch signal that is activated when the pulse of the auto-precharge command is input and the latch signal generator outputs the latch signal that is inactivated when the active pulse is input or the internal signal activated is input into the inversion delay circuit.

14. The semiconductor memory device according to claim 5, wherein the auto-precharge command is generated in a pulse when an auto-precharge read or write command is input.

* * * * *